US012563914B2

(12) United States Patent
Liu et al.

(10) Patent No.: US 12,563,914 B2
(45) Date of Patent: Feb. 24, 2026

(54) DISPLAY PANEL FOR REDUCING WIRING CONFLICT, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Biao Liu, Beijing (CN); Mengmeng Du, Beijing (CN); Xiangdan Dong, Beijing (CN); Hongwei Ma, Beijing (CN); Tinghua Shang, Beijing (CN); Haigang Qing, Beijing (CN); Pengfei Yu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 750 days.

(21) Appl. No.: 16/973,637

(22) PCT Filed: Mar. 20, 2020

(86) PCT No.: PCT/CN2020/080393

§ 371 (c)(1),
(2) Date: Dec. 9, 2020

(87) PCT Pub. No.: WO2021/184348

PCT Pub. Date: Sep. 23, 2021

(65) Prior Publication Data

US 2022/0059635 A1 Feb. 24, 2022

(51) Int. Cl.
| | |
|---|---|
| *H10K 59/131* | (2023.01) |
| *G09G 3/00* | (2006.01) |
| *H10K 59/121* | (2023.01) |
| *H10K 59/122* | (2023.01) |
| *H10K 102/00* | (2023.01) |

(52) U.S. Cl.
CPC ........... *H10K 59/131* (2023.02); *G09G 3/006* (2013.01); *H10K 59/1213* (2023.02);
(Continued)

(58) Field of Classification Search
CPC ............... H10K 59/131; H10K 59/122; H10K 59/1213; H10K 59/1216; H10K 2102/311; G09G 3/006; G09G 2330/04
See application file for complete search history.

(56) References Cited

U.S. PATENT DOCUMENTS

| | | | | |
|---|---|---|---|---|
| 10,462,896 | B1 * | 10/2019 | Kwon | ................... G06F 1/1626 |
| 2002/0074551 | A1 * | 6/2002 | Kimura | .................. H04N 1/028 |
| | | | | 438/149 |

(Continued)

FOREIGN PATENT DOCUMENTS

| | | | | |
|---|---|---|---|---|
| CN | 110187797 A | 8/2019 | | |
| JP | 2000236097 A | * 8/2000 | ......... | H01L 27/1214 |

OTHER PUBLICATIONS

European Application No. 20897623.3, Extended European Search Report, dated Jan. 5, 2023.

*Primary Examiner* — Norman D Richards
*Assistant Examiner* — Sean Ayers Winters
(74) *Attorney, Agent, or Firm* — DINSMORE & SHOHL LLP

(57) ABSTRACT

The present disclosure provides a display panel and a display device. The display panel includes a display area and a peripheral area. The display area includes a plurality of sub-pixels on a substrate. The peripheral area including: a bending area; a plurality of multiplexers on a side of the bending area away from the display area and on the substrate, and each multiplexer is at least connected with a signal input line and two signal output lines; and a bonding area on a side of the plurality of multiplexers away from the bending area. The plurality of multiplexers are electrically (Continued)

connected to the plurality of sub-pixels through the bending area. The signal input line is electrically connected to the bonding area. An orthographic projection of the signal input line on the substrate does not overlap with an orthographic projection of the bending area on the substrate.

11 Claims, 10 Drawing Sheets

(52) U.S. Cl.
CPC ....... *H10K 59/1216* (2023.02); *H10K 59/122* (2023.02); *G09G 2330/04* (2013.01); *H10K 2102/311* (2023.02)

(56) References Cited

U.S. PATENT DOCUMENTS

| | | | | |
|---|---|---|---|---|
| 2007/0268420 | A1* | 11/2007 | Tsai | G09G 3/20 |
| | | | | 349/40 |
| 2009/0122035 | A1* | 5/2009 | Ito | G09G 3/3688 |
| | | | | 345/204 |
| 2013/0278574 | A1* | 10/2013 | Ito | G09G 3/34 |
| | | | | 345/204 |
| 2014/0049449 | A1 | 2/2014 | Park et al. | |
| 2015/0144984 | A1* | 5/2015 | Chen | H01L 33/382 |
| | | | | 257/99 |
| 2015/0351168 | A1* | 12/2015 | Yasumoto | H05B 33/04 |
| | | | | 428/448 |
| 2015/0379921 | A1* | 12/2015 | Lee | H10K 59/80522 |
| | | | | 345/82 |
| 2016/0170529 | A1 | 6/2016 | Lee | |
| 2016/0179229 | A1* | 6/2016 | Ahn | H10K 59/1213 |
| | | | | 345/173 |
| 2016/0380022 | A1* | 12/2016 | Shu | H01L 27/14612 |
| | | | | 378/98.8 |
| 2017/0287937 | A1* | 10/2017 | Ka | H10K 59/131 |
| 2017/0373275 | A1* | 12/2017 | Frantz | H10K 77/111 |
| 2019/0041915 | A1* | 2/2019 | Park | H10K 77/111 |
| 2019/0228730 | A1* | 7/2019 | Cong | G09G 3/006 |
| 2021/0118970 | A1* | 4/2021 | Song | H01L 25/18 |
| 2021/0351256 | A1* | 11/2021 | Shu | H10K 59/13 |

* cited by examiner 2201          2202

DISPLAY PANEL FOR REDUCING WIRING CONFLICT, AND DISPLAY DEVICE

CROSS-REFERENCE TO RELATED APPLICATIONS

The present application is a U.S. National Stage Application under 35 U.S.C. § 371 of International Patent Application No. PCT/CN2020/080393, filed on Mar. 20, 2020, the disclosure of which is incorporated by reference herein in its entirety.

TECHNICAL FIELD

The present disclosure relates to a display panel and a display device.

BACKGROUND

During the process of narrowing a lower frame of an OLED (Organic Light Emitting Diode) display screen, a circuit layout design of a Pad area in a backplane of the display device is particularly important. A driving method of the OLED is complicated. In addition, in order to improve the resolution of the display, pixels within a display area of the display may be increased, so that more signal lines need be arranged and designed to control these pixels. This results in that IC (Integrated Circuit) requires more pins to output pixel driving signals. However, excessive pins may lead to complex bonding of the integrated circuit, and may make the implementation of COP (Chip on Plastic) process or COF (Chip On Film) process more difficult. Therefore, in the related art, a multiplexer (referred to as Mux for short) circuit is provided to reduce the number of pins in the integrated circuit.

In the related art, a plurality of multiplexers are provided in the display panel. Each multiplexer may use one data signal source in the IC to drive two columns of sub-pixels in the display panel. In this way, the number of pins in the IC can be reduced, the process difficulty of the module can be lessened and the size of the IC can be reduced. Since the multiplexer has the above-described advantages, the multiplexer is increasingly applied in the display panel (for example, AMOLED (Active-matrix Organic Light Emitting Diode) display panel).

SUMMARY

According to an aspect of embodiments of the present disclosure, a display panel is provided. The display panel comprises: a display area comprising a pixel array on a substrate, the pixel array comprising a plurality of sub-pixels; and a peripheral area surrounding the display area, the peripheral area comprising: a bending area on a side of the display area; a plurality of multiplexers on a side of the bending area away from the display area, wherein the plurality of multiplexers are on the substrate, the plurality of multiplexers are electrically connected to the plurality of sub-pixels through the bending area, and each of the plurality of multiplexers is at least connected with a signal input line and two signal output lines, an orthographic projection of the signal input line on the substrate does not overlap with an orthographic projection of the bending area on the substrate; and a bonding area on a side of the plurality of multiplexers away from the bending area, wherein the bonding area is electrically connected to the signal input line.

In some embodiments, the plurality of multiplexers comprise a first multiplexer and a second multiplexer, the second multiplexer being further away from the bending area than the first multiplexer.

In some embodiments, each of the two signal output lines is electrically connected to a column of sub-pixels.

In some embodiments, the two signal output lines of the second multiplexer are between two first multiplexers adjacent to the second multiplexer.

In some embodiments, the display panel further comprises: a first fanout area between the bending area and the display area; a second fanout area between the bending area and the plurality of multiplexers; and a third fanout area between the plurality of multiplexers and the bonding area; wherein the bonding area is electrically connected to the plurality of multiplexers through the third fanout area, and the plurality of multiplexers are electrically connected to the plurality of sub-pixels through the second fanout area, the bending area and the first fanout area.

In some embodiments, the display panel further comprises: a cell test area between the plurality of multiplexers and the second fanout area, wherein the cell test area is electrically connected to the plurality of sub-pixels through the second fanout area, the bending area and the first fanout area; and an electrostatic discharge area between the cell test area and the plurality of multiplexers, wherein the electrostatic discharge area is electrically connected to the plurality of multiplexers, and the electrostatic discharge area is electrically connected to the cell test area.

In some embodiments, each of the plurality of multiplexers comprises: a first transistor comprising a first electrode, a second electrode, and a control electrode, wherein the first electrode is electrically connected to the bonding area through the signal input line, the first electrode is configured to receive a data signal, the second electrode of the first transistor is electrically connected to a first column of sub-pixels through one signal output line of the two signal output lines, and the control electrode of the first transistor is configured to receive a first control signal; and a second transistor comprising the first electrode shared with the first transistor, a second electrode, and a control electrode, wherein the second electrode of the second transistor is electrically connected to a second column of sub-pixels through another signal output line of the two signal output lines, and the control electrode of the second transistor is configured to receive a second control signal.

In some embodiments, each of the plurality of sub-pixels comprises: a third transistor comprising: an active layer; a first insulating layer covering the active layer; a gate on a side of the first insulating layer away from the active layer; a second insulating layer covering the gate; an interlayer insulating layer on a side of the second insulating layer away from the gate; and a source and a drain on a side of the interlayer insulating layer away from the second insulating layer, the source and the drain each being electrically connected to the active layer; and a capacitor comprising: a first conductive layer in the same layer as the gate, wherein the first conductive layer is covered by the second insulating layer; and a second conductive layer on a side of the second insulating layer away from the first conductive layer, wherein the second conductive layer is covered by the interlayer insulating layer.

In some embodiments, in each of the plurality of multiplexers, the first electrode, the second electrode of the first transistor, and the second electrode of the second transistor are all in the same layer as the source and the drain, and the control electrode of the first transistor and the control electrode of the second transistor are in the same layer as the gate.

In some embodiments, the signal input line of the first multiplexer and the signal input line of the second multiplexer are in different layers.

In some embodiments, the first electrode of the first multiplexer is electrically connected to the signal input line of the first multiplexer, and the signal input line of the first multiplexer is in the same layer as the second conductive layer; and the first electrode of the second multiplexer is electrically connected to the signal input line of the second multiplexer, and the signal input line of the second multiplexer is in the same layer as the gate.

In some embodiments, the two signal output lines comprise: a first signal output line in the same layer as the second conductive layer, wherein the first signal output line is electrically connected to the second electrode of the first transistor; and a second signal output line in the same layer as the gate, wherein the second signal output line is electrically connected to the second electrode of the second transistor.

In some embodiments, each of the plurality of sub-pixels further comprises: a third insulating layer covering the source and the drain; a first planarization layer on a side of the third insulating layer away from the source and the drain; a third conductive layer on a side of the first planarization layer away from the third insulating layer, wherein the third conductive layer is electrically connected to the source or the drain; a second planarization layer covering the third conductive layer; an anode layer on a side of the second planarization layer away from the third conductive layer, wherein the anode layer is electrically connected to the third conductive layer; a pixel defining layer on the second planarization layer, the pixel defining layer comprising an opening exposing at least a part of the anode layer; a functional layer in the opening and connected to the anode layer; and a cathode layer on a side of the functional layer away from the anode layer.

In some embodiments, the bending area comprises a plurality of first wires, each of which is in the same layer as the third conductive layer, and is electrically connected to the display area through a second wire or a third wire, wherein the second wire is in the same layer as the gate, and the third wire is in the same layer as the second conductive layer.

According to another aspect of embodiments of the present disclosure, a display device is provided. The display device comprises the display panel as described previously.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

4

Figure 2:
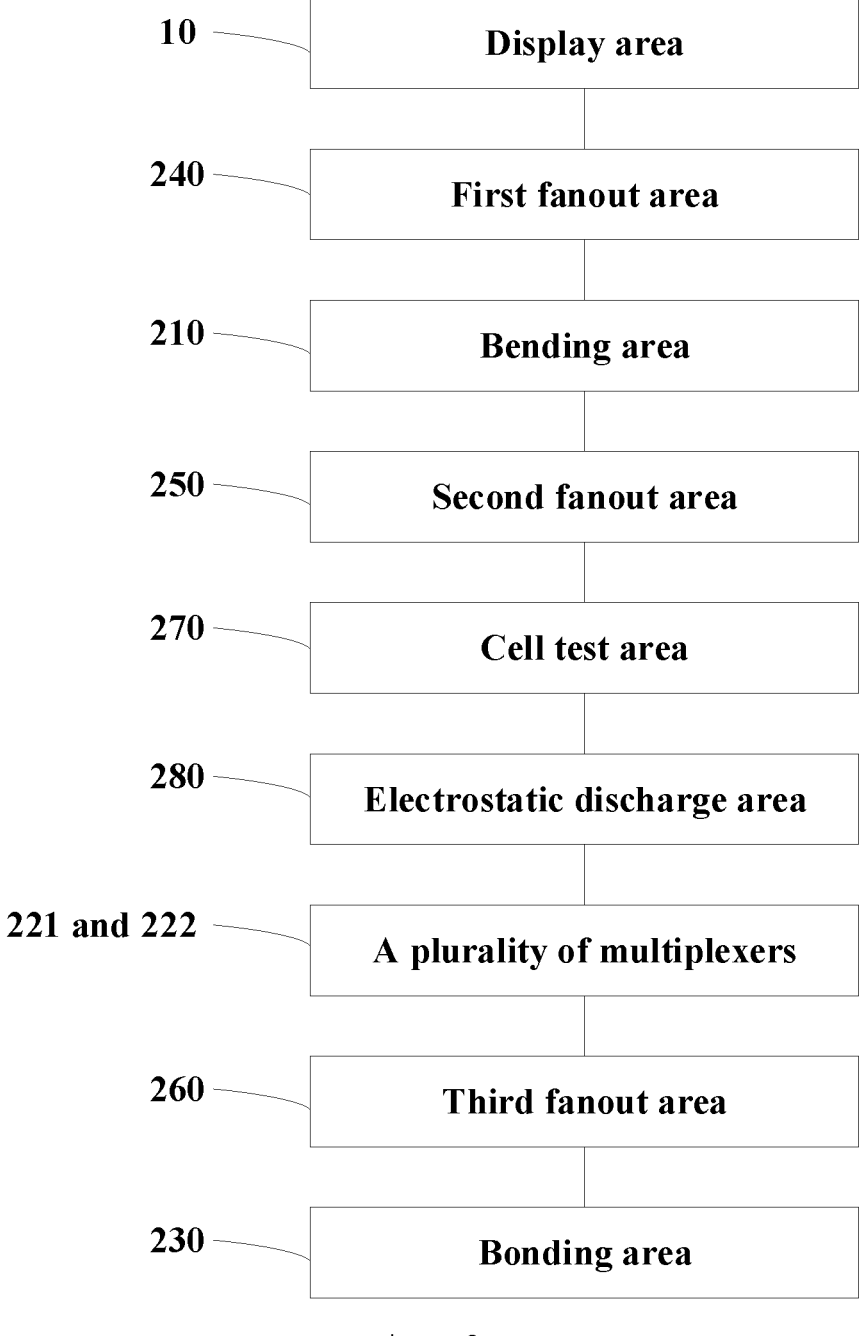
Figure 3A:
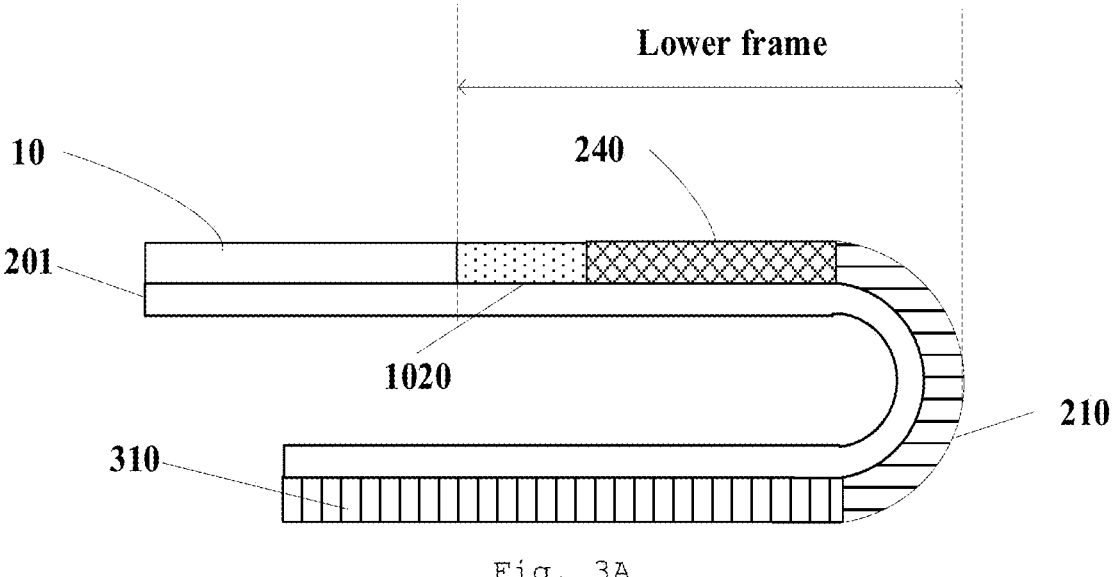
Figure 3B:
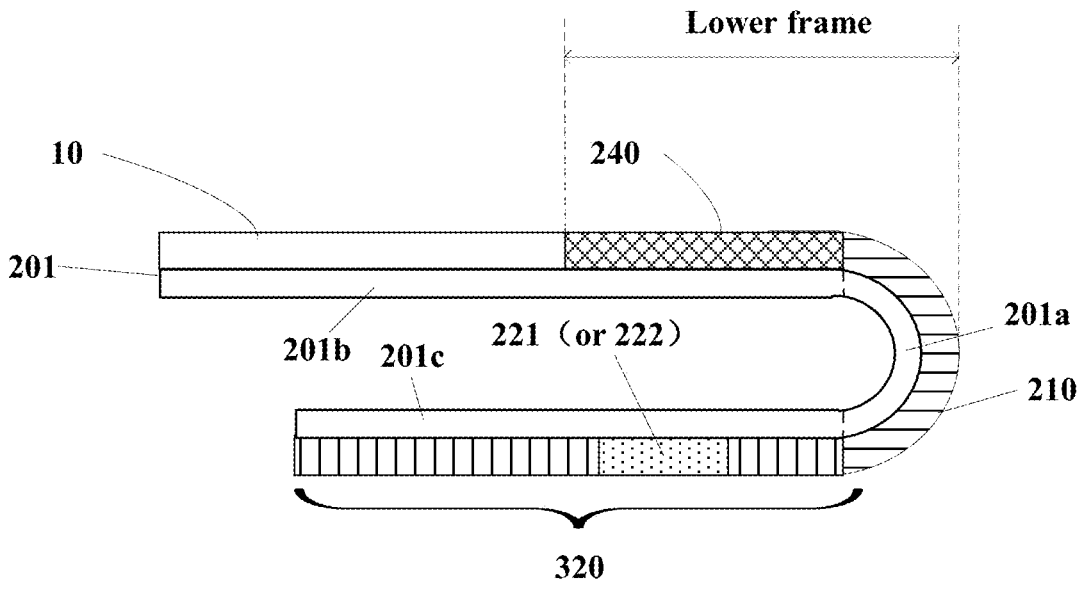
Figure 4:
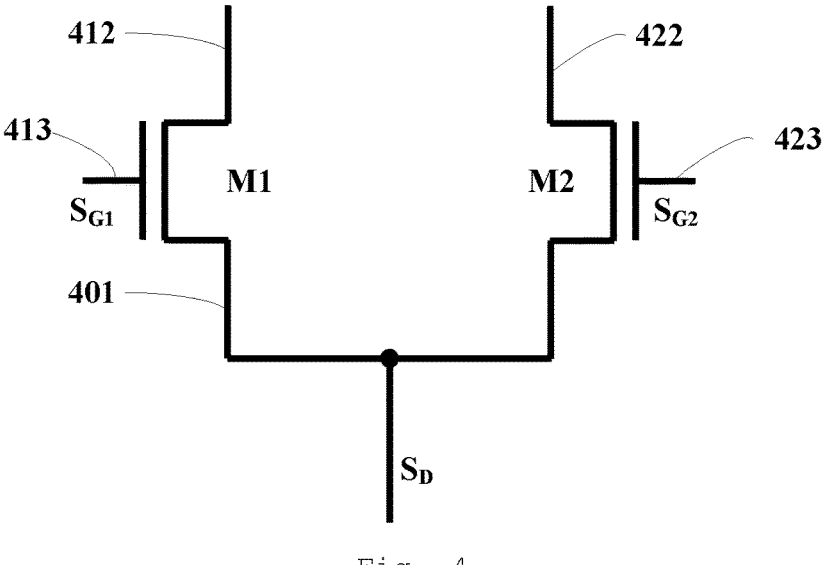
Figure 5:
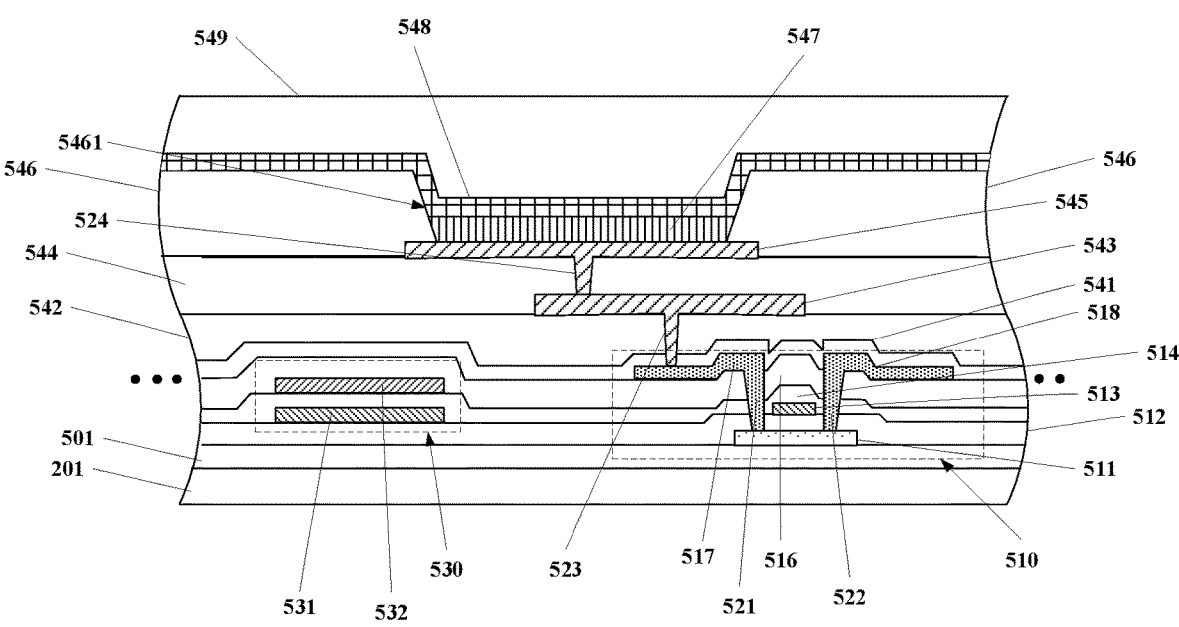
Figures 6A, 6B:
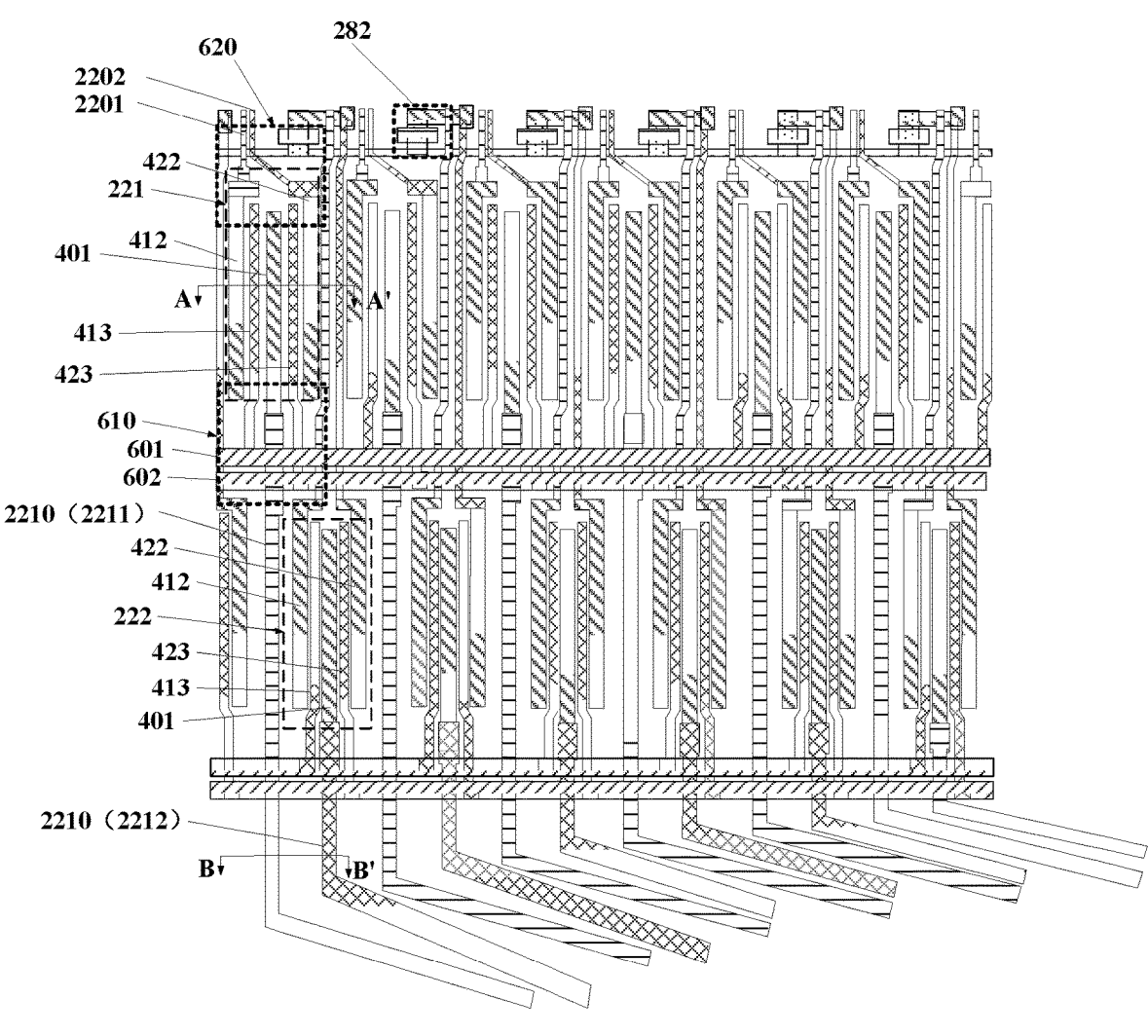
Figure 6C:
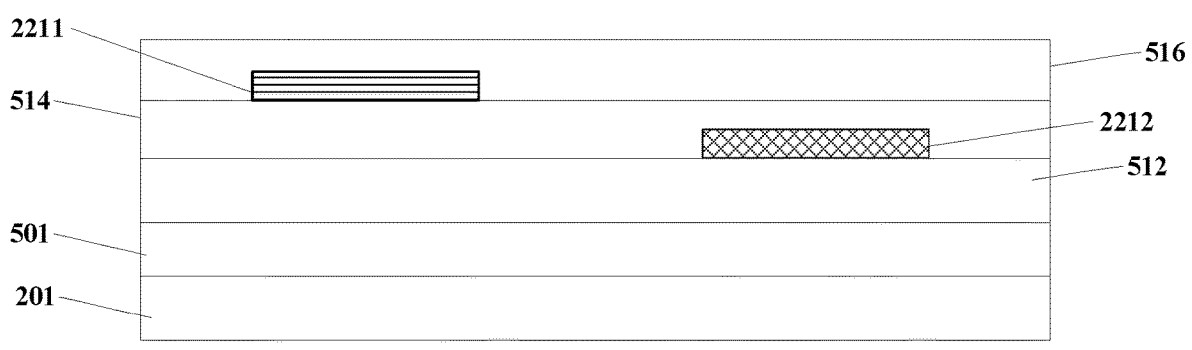
Figure 7A:
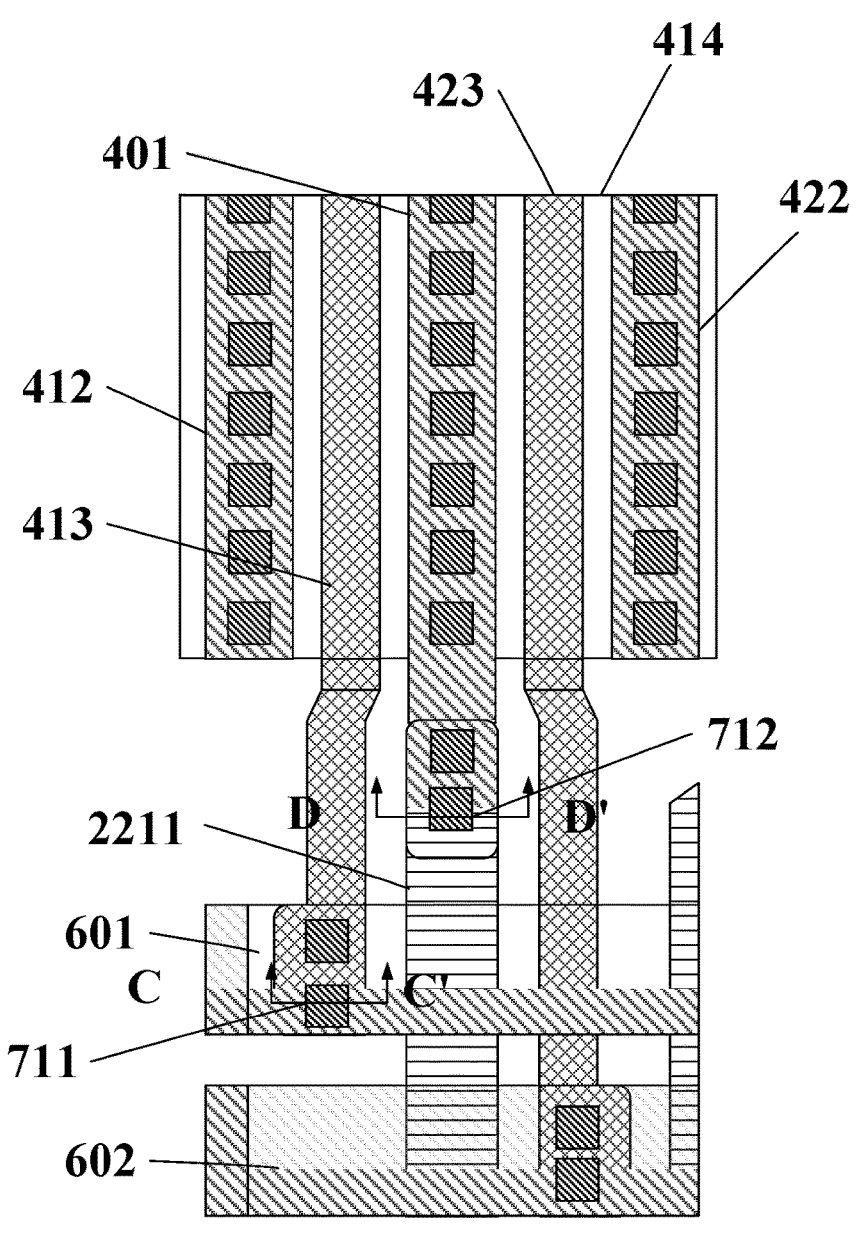
Figure 7B:
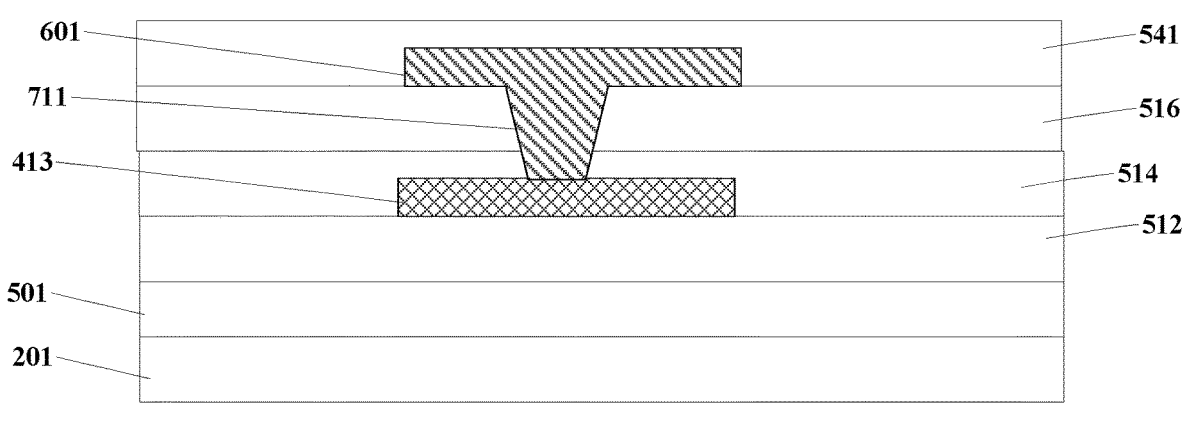
Figure 7C:
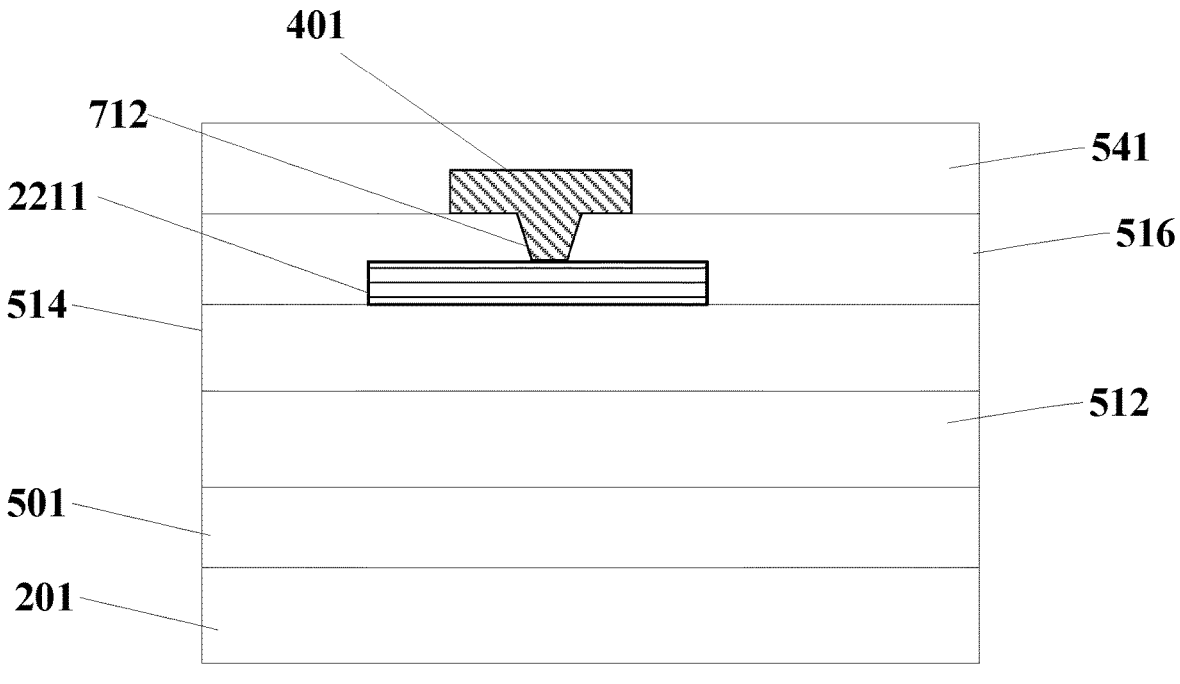
Figure 9:
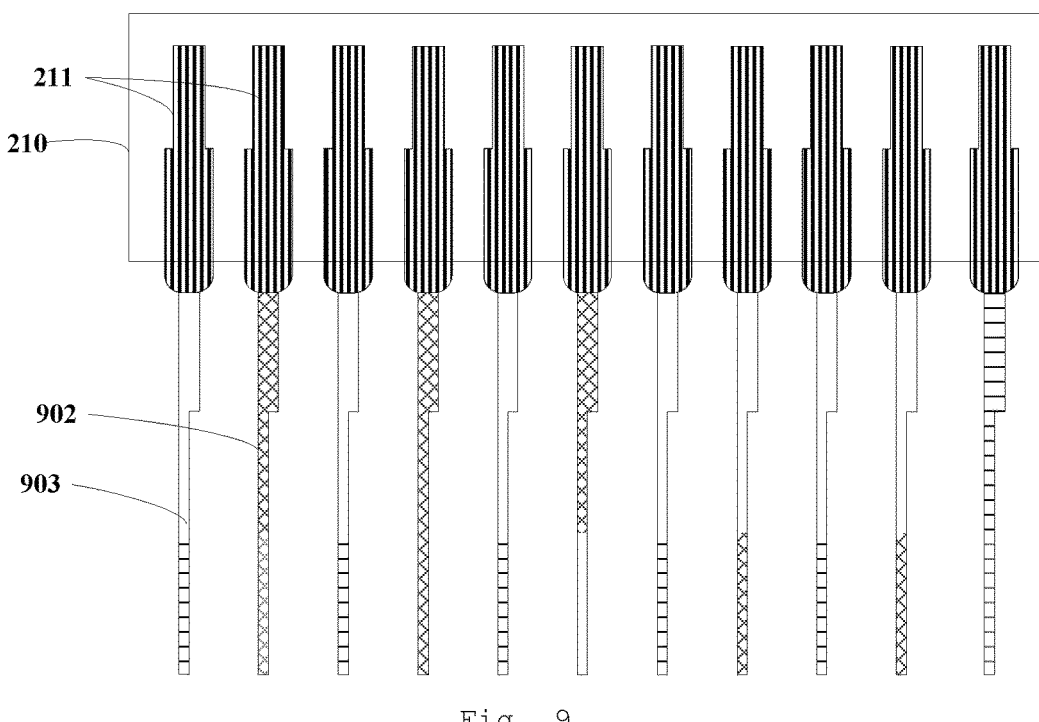
Figure 10:
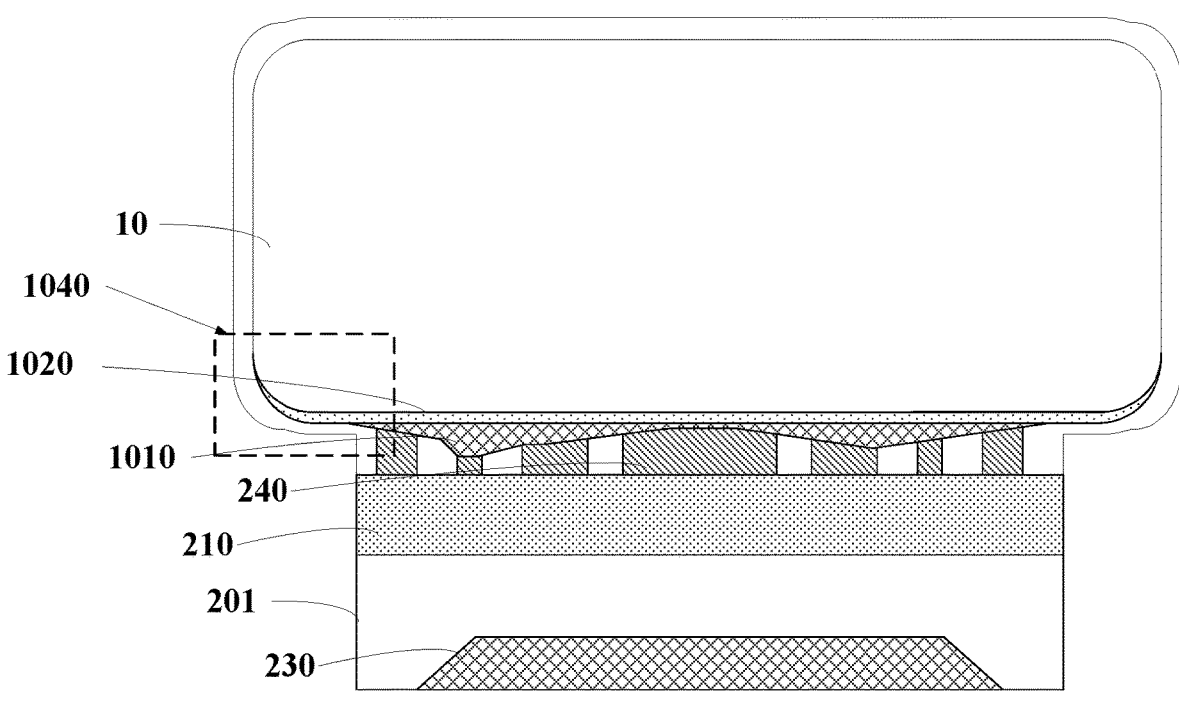
Figure 11:
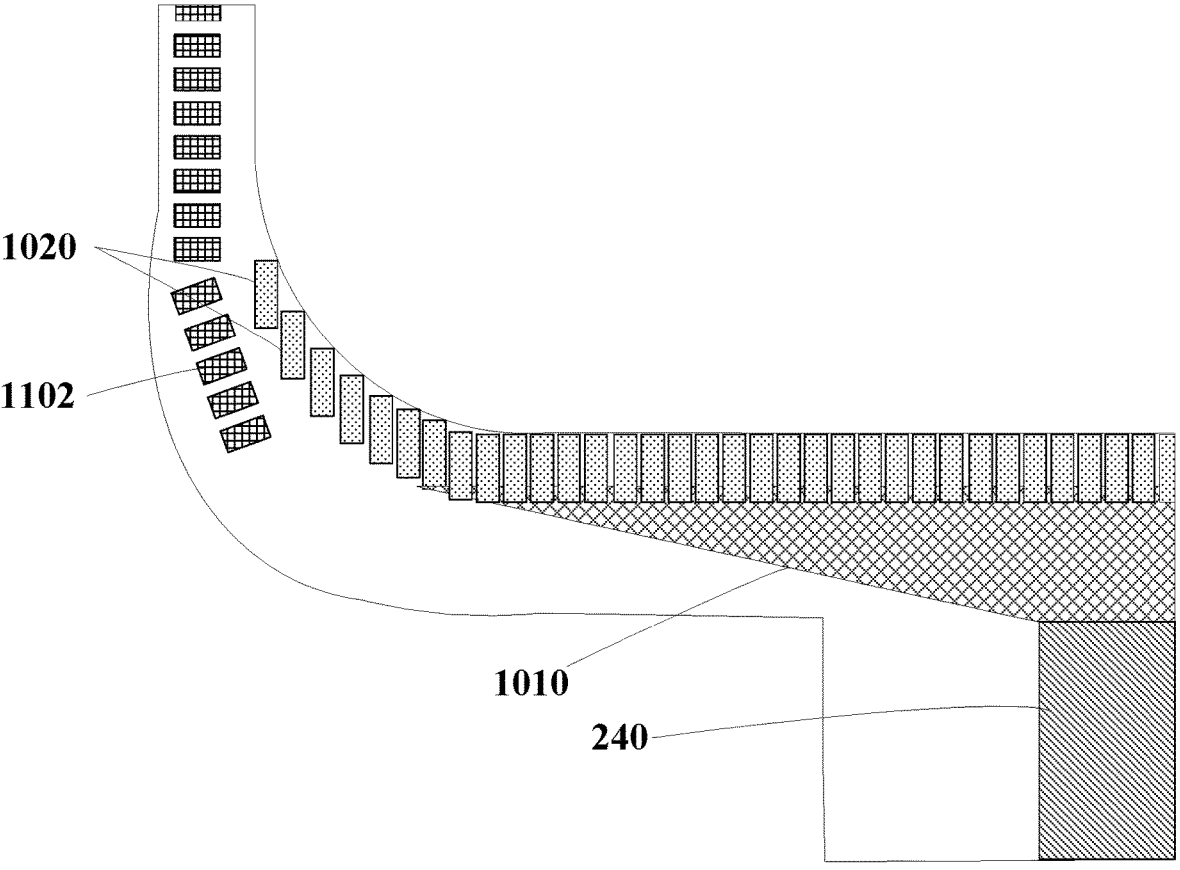

FIG. 2 is a schematic view showing a structural connection of a peripheral area of a display panel according to an embodiment of the present disclosure;

FIG. 3A is a schematic cross-sectional view showing a display panel in a related art;

FIG. 3B is a schematic cross-sectional view showing a display panel according to an embodiment of the present disclosure;

FIG. 4 is a schematic view showing a circuit connection of a multiplexer according to an embodiment of the present disclosure;

FIG. 5 is a schematic cross-sectional view showing a sub-pixel of a display panel according to an embodiment of the present disclosure;

FIG. 6A is a top view showing a multiplexer according to an embodiment of the present disclosure;

FIG. 6B is a schematic view showing a cross-section of a multiplexer according to an embodiment of the present disclosure taken along a line A-A' in FIG. 6A;

FIG. 6C is a schematic view showing a cross-section of a multiplexer according to an embodiment of the present disclosure taken along a line B-B' in FIG. 6A;

FIG. 7A is an enlarged schematic view showing a partial structure of a multiplexer according to an embodiment of the present disclosure at block 610 shown in FIG. 6A;

FIG. 7B is a schematic view showing a cross-section of a structure taken along a line C-C' in FIG. 7A;

FIG. 7C is a schematic view showing a cross-section of a structure taken along a line D-D' in FIG. 7A;

Figures 8A, 8B:
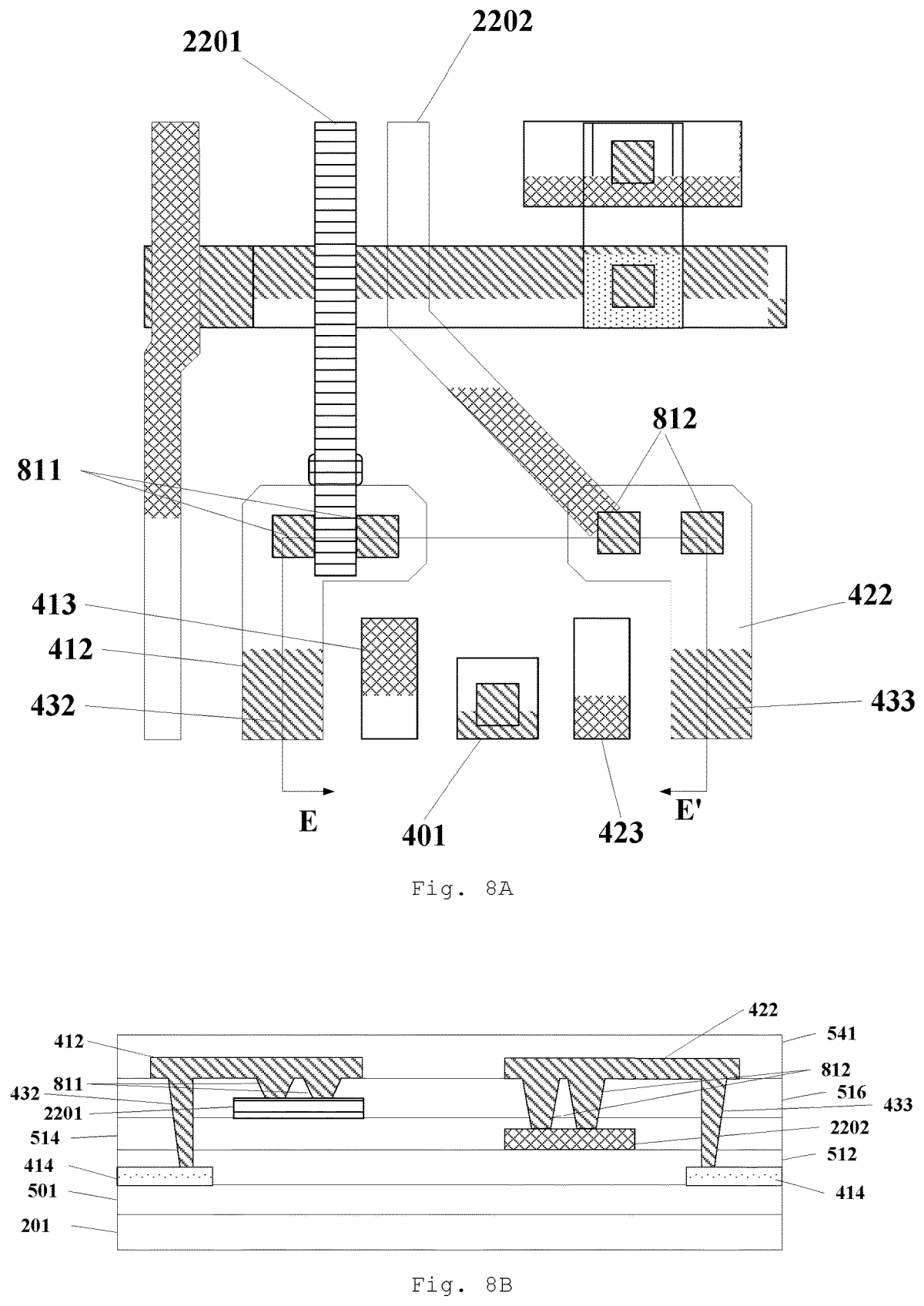

FIG. 8A is an enlarged schematic view showing a partial structure of a multiplexer according to an embodiment of the present disclosure at block 620 shown in FIG. 6A;

FIG. 8B is a schematic view showing a cross-section of a structure taken along a line E-E' in FIG. 8A;

FIG. 9 is a schematic view showing a structure of a bending area of a display panel according to an embodiment of the present disclosure;

FIG. 10 is a schematic view showing a structure of a display panel in a related art;

FIG. 11 is an enlarged schematic view showing a partial structure of a display panel in a related art at block 1040 shown in FIG. 10.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical equations, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or similar words means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

FIG. 10 is a schematic view showing a structure of a display panel in a related art. As shown in FIG. 10, the display panel comprise a display area 10, a substrate 201, a bending area 210, a bonding area 230, a first fanout area 240, a fan-shaped circuit connection area 1010 and a plurality of multiplexers 1020. As shown in FIG. 10, the multiplexer 1020 is disposed between the display area 10 and the bending area 210. The multiplexer 1020 is below the display area 10. FIG. 11 is an enlarged schematic view showing a partial structure of a display panel in a related art at block 1040 shown in FIG. 10. As shown in FIG. 11, the display panel also comprises a GOA circuit (Gate Driver on Array, also i.e., a gate driving circuit) 1102 at the frame of the display panel.

The inventors of the present disclosure have found that, as shown in FIG. 11, in the related art, since the multiplexer 1020 is disposed between the display area 10 and the bending area 210, and a signal line of the GOA circuit at a lower fillet or corner position of the display panel is required to be transversely connected to the sub-pixels of the display area, the signal line of the GOA circuit and the multiplexer 1020 placed vertically at the fillet are likely to cause a wiring conflict.

In view of this, the inventors of the present disclosure propose a display panel to reduce the wiring conflict between the multiplexer and the signal line of the GOA circuit. The display panel according to some embodiments of the present disclosure will be described in detail below in conjunction with the accompanying drawings.

Figure 1:
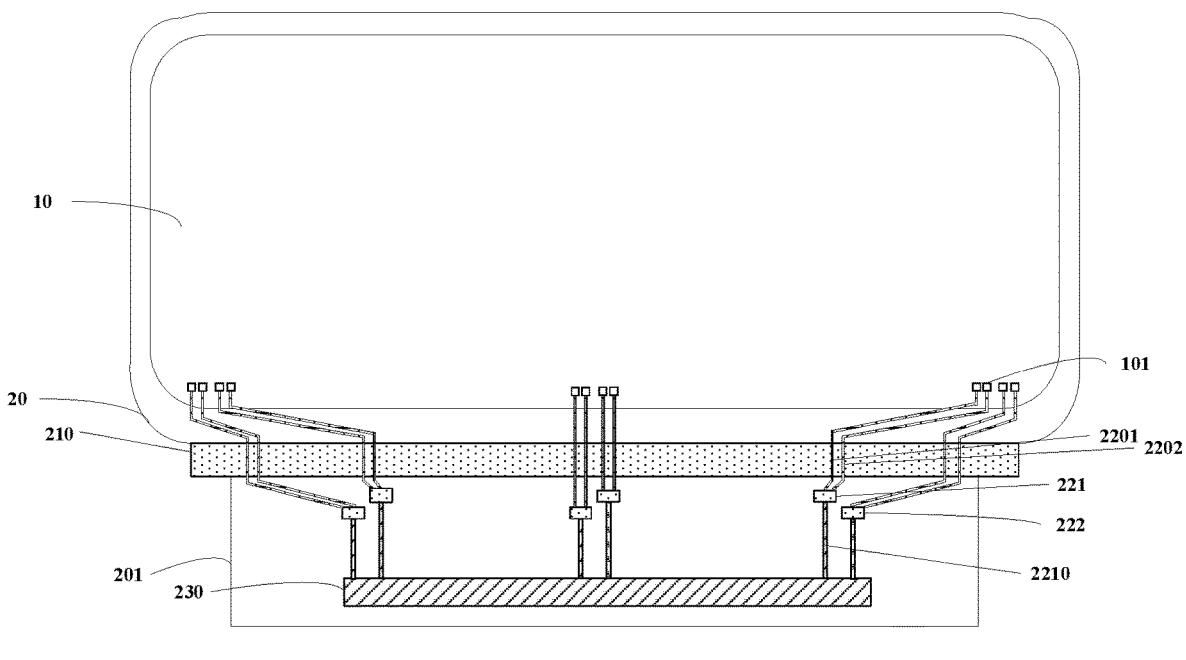
FIG. 1 is a schematic view showing a structure of a display panel according to an embodiment of the present disclosure.

FIG. 1 is a schematic view showing a structure of a display panel according to an embodiment of the present disclosure.

As shown in FIG. 1, the display panel comprises a display area 10 and a peripheral area 20 surrounding the display area 10. The display area 10 comprises a pixel array on a substrate (for example, a substrate 201 shown in FIG. 3B or FIG. 5 later). The pixel array comprises a plurality of sub-pixels 101. The peripheral area 20 comprises a bending area 210 on a side of the display area 10, a plurality of multiplexers 221 and 222 on a side of the bending area 210 away from the display area 10, and a bonding area 230 on a side of the plurality of multiplexers away from the bending area 210. The multiplexers 221 and 222 are on the substrate.

It should be noted that, in the embodiments of the present disclosure, the display area may comprise a part of the substrate below the display area, and the peripheral area may comprise another part of the substrate below the peripheral area.

In some embodiments, as shown in FIG. 1, each multiplexer is at least connected with one signal input line 2210 and two signal output lines 2201 and 2202. The signal input line 2210 is electrically connected to the bonding area 230. An orthographic projection of the signal input line 2210 on the substrate does not overlap with an orthographic projection of the bending area 210 on the substrate. In some embodiments, each signal output line 2201 or 2202 is electrically connected to a column of sub-pixels 101. In this way, it is possible to reduce the number of pins in the integrated circuit, and lessen the process difficulty and cost of the module.

For example, the bonding area 230 comprises bonding terminals (for example, COP) for bonding an integrated circuit, or a signal input line for COF. The bonding area 230 is electrically connected to the plurality of multiplexers. The plurality of multiplexers are electrically connected to the plurality of sub-pixels 101 through the bending area 210.

So far, a display panel according to some embodiments of the present disclosure is provided. The display panel comprises a display area and a peripheral area surrounding the display area. The display area comprises a pixel array on a substrate. The pixel array comprises a plurality of sub-pixels. The peripheral area comprises: a bending area on a side of the display area; a plurality of multiplexers on a side of the bending area away from the display area; and a bonding area on a side of the plurality of multiplexers away from the bending area. The plurality of multiplexers are on the substrate. Each multiplexer is at least connected with one signal input line and two signal output lines. The bonding area is electrically connected to the plurality of multiplexers. The plurality of multiplexers are electrically connected to the plurality of sub-pixels through the bending area. The signal input line is electrically connected to the bonding area. An orthographic projection of the signal input line on the substrate does not overlap with an orthographic projection of the bending area on the substrate. In the display panel, the plurality of multiplexers are disposed between the bending area and the bonding area, that is, below bending area, so that a wiring conflict between the multiplexer and a signal line of a GOA circuit may be reduced. In addition, such design may also reduce the signal interference between the multiplexer and the signal line of the GOA circuit.

In addition, in the related art, since the multiplexer is provided between the display area and the bending area, the multiplexer is likely to be affected by a bending crack in the bending area. In the embodiments of the present disclosure, the multiplexer is disposed below the bending area. In this way, on the one hand, the number of the pins of the integrated circuit is reduced, and the cost of the integrated circuit and the difficulty of bending are lessened; on the other hand, a risk of a bending crack is also avoided as much as possible, thereby improving the yield.

In some embodiments, as shown in FIG. 1, the plurality of multiplexers comprise a first multiplexer 221 and a second multiplexer 222. The second multiplexer 222 is further away from the bending area 210 than the first multiplexer 221. For example, the signal output lines of the second multiplexer 222 are between two first multiplexers 221 adjacent to the second multiplexer 222. In other words, the signal output lines of the second multiplexer 222 pass between the two first multiplexers adjacent to the second multiplexer.

In the embodiment, the plurality of multiplexers comprise two rows of multiplexers. The two rows of multiplexers comprise a first multiplexer and a second multiplexer arranged in a staggered manner. The first multiplexer is in a first row, and the second multiplexer is in a second row. In other words, in the case where a certain multiplexer is in the first row, a multiplexer adjacent to the multiplexer is in the second row; and in the case where a certain multiplexer is in the second row, a multiplexer adjacent to the multiplexer is in the first row.

In the above-described embodiment, by arranging the plurality of multiplexers into two rows of multiplexers, a transverse width of the Pad area in the peripheral area (that is, a width of the Pad area is in a row direction of the plurality of multiplexers) can be reduced, and a length of the wiring of the multiplexers at both ends away from the bonding area can be reduced, thereby reducing the impedance of the wiring and improving the stability of the signal.

It should be noted that, although two rows of multiplexers are shown in FIG. 1, those skilled in the art can understand that three or more rows of multiplexers may be provided. Therefore, the scope of the embodiments of the present disclosure is not limited thereto.

FIG. 2 is a schematic view showing a structural connection of a peripheral area of a display panel according to an embodiment of the present disclosure. As shown in FIG. 2, the display panel comprises the bending area 210, the plurality of multiplexers 221 and 222, and the bonding area 230.

In some embodiments, as shown in FIG. 2, the display panel further comprises a first fanout area 240 between the bending area 210 and the display area 10. In some embodiments, as shown in FIG. 2, the display panel further comprises a second fanout area 250 between the bending area 210 and the plurality of multiplexers 221 and 222. In some embodiments, as shown in FIG. 2, the display panel further comprises a third fanout area 260 between the plurality of multiplexers 221 and 222 and the bonding area 230. The bonding area 230 is electrically connected to the plurality of multiplexers through the third fanout area 260. The plurality of multiplexers are electrically connected to the plurality of sub-pixels in the display area 10 through the second fanout area 250, the bending area 210, and the first fanout area 240.

In some embodiments, as shown in FIG. 2, the display panel further comprises a cell test (referred to as CT for short) area 270 between the plurality of multiplexers 221 and 222 and the second fanout area 250. The cell test area 270 is electrically connected to the plurality of sub-pixels through the second fanout area 250, the bending area 210, and the first fanout area 240.

In some embodiments, as shown in FIG. 2, the display panel further comprises an electrostatic discharge area 280 between the cell test area 270 and the plurality of multiplexers 221 and 222. The plurality of multiplexers are electrically connected to the electrostatic discharge area 280.

The electrostatic discharge area (referred to as ESD for short) 280 is electrically connected to the cell test area 270.

So far, the structure of the peripheral area of the display panel according to some embodiments of the present disclosure is provided. For example, the data signal may sequentially pass through the bonding area 230, the third fanout area 260, the plurality of multiplexers 221 or 222, the electrostatic discharge area 280, the cell test area 270, the second fanout area 250, the bending area 210 and the first fanout area 240, and is transmitted to the sub-pixels in the display area 10 to drive the sub-pixels to emit light. In this way, the display function of the display panel may be realized.

FIG. 3A is a schematic cross-sectional view showing a display panel in a related art.

FIG. 3A shows the display area 10, the multiplexer 1020, the first fanout area 240, the bending area 210, the Pad area 310, and the substrate 201. In the embodiment, the Pad area 310 may comprise: the second fanout area, the cell test area, the electrostatic discharge area, the third fanout area, and the bonding area. The lower frame of the display panel comprises a portion of the peripheral area from the multiplexer 1020 to a bending portion of the bending area 210. The inventors of the present disclosure have found that in the related art, since the multiplexer 1020 is disposed between the display area 10 and the bending area 210, it is not favorable for narrowing the lower frame.

FIG. 3B is a schematic cross-sectional view showing a display panel according to an embodiment of the present disclosure.

FIG. 3B shows the display area 10, the first fanout area 240, the bending area 210, the multiplexer 221 or 222, the Pad area 320, and the substrate 201. In the embodiment, the Pad area 320 may comprise: the second fanout area, the cell test area, the electrostatic discharge area, the multiplexer 221 or 222, the third fanout area, and the bonding area. In the embodiment, since the multiplexer 221 or 222 is disposed below the bending area, that is, the multiplexer is disposed on the back of the display panel, compared to the display panel shown in FIG. 3A, the display panel of some embodiments of the present disclosure may apparently narrow the lower frame. For example, the lower frame of the display panel in the embodiment may be reduced by about 190 micrometers (μm). Therefore, the display panel of the embodiments of the present disclosure may not only reduce a conflict between the multiplexer and the signal line of the GOA circuit, but also make the lower frame of the display panel narrower, thereby promoting the realization of a full screen.

Here, the bending area refers to an area from a starting position of a surface curvature of the substrate to an ending position of the surface curvature of the substrate, or may also be considered to refer to a position interval where a curvature of the substrate changes, as shown in FIG. 3B.

In some embodiments, the substrate 201 comprises a first portion 201a covering by the bending area 210, and a second portion 201b and a third portion 201c which are connected to the first portion, the second portion 201b and the third portion 201c are opposite to each other such that a projection of the third portion 201c onto the second portion 201b overlapping the second portion 201b, the display area 10 and the first fanout area 240 are on a surface of the second portion 201b facing away from the third portion 201c, and the second fanout area, the cell test area, the electrostatic discharge area, the plurality of multiplexers, the third fanout area and the bonding area in the Pad area 320 are disposed on a surface of the third portion 201c facing away from the second portion 201b.

FIG. 4 is a schematic view showing a circuit connection of a multiplexer according to an embodiment of the present disclosure.

As shown in FIG. 4, each multiplexer 221 (or 222) comprises a first transistor M1 and a second transistor M2. The first transistor M1 and the second transistor M2 share a first electrode 401. The first electrode 401 is electrically connected to the bonding area 230 through the signal input line. The first electrode is configured to receive a data signal $S_D$.

A second electrode 412 of the first transistor M1 is electrically connected to a first column of sub-pixels through one signal output line of the two signal output lines. A control electrode 413 of the first transistor M1 is configured to receive a first control signal $S_{G1}$. The first transistor M1 is configured to be turned on or off under the control of the first control signal $S_{G1}$.

A second electrode 422 of the second transistor M2 is electrically connected to a second column of sub-pixels through the other signal output line of the two signal output lines. The second column of sub-pixels are different from the first column of sub-pixels. A control electrode 423 of the second transistor M2 is configured to receive a second control signal $S_{G2}$. The second transistor M2 is configured to be turned on or off under the control of the second control signal $S_{G2}$.

So far, the circuit structure of the multiplexer according to some embodiments of the present disclosure is provided. In the multiplexer, the first control signal is used to control the first transistor, and the second control signal is used to control the second transistor, so that the data signal received by the common electrode (i.e., the first electrode) of the two switching transistors is transmitted to a corresponding sub-pixel through the first transistor or the second transistor, so as to implement that the sub-pixel emits light. The multiplexer may reduce the number of pins of the integrated circuit and lessen the difficulty and cost of the module process.

In some embodiments, the first transistor M1 and the second transistor are NMOS (N-channel Metal Oxide Semiconductor) transistors. In other embodiments, the first transistor M1 and the second transistor are PMOS (P-channel Metal Oxide Semiconductor) transistors.

FIG. 5 is a schematic cross-sectional view showing a sub-pixel of a display panel according to an embodiment of the present disclosure. As shown in FIG. 5, each sub-pixel comprises a pixel circuit for driving the sub-pixel to emit light. The pixel circuit comprises a third transistor 510 and a capacitor 530. That is, each sub-pixel comprises the third transistor 510 and the capacitor 530. The third transistor 510 and the capacitor 530 are both above the substrate 201. For example, the third transistor 510 is a switching transistor or a driving transistor.

In some embodiments, the above-described pixel circuit may be a pixel circuit such as 2T1C, 3T1C, 7T1C, 7T2C, 9T1C, or 9T2C. Here, "T" represents a transistor, and "C" represents a capacitor. For example, 2T1C represents a pixel circuit comprising 2 transistors and 1 capacitor. Of course, those skilled in the art can understand that the pixel circuit herein is not limited to the pixel circuit disclosed here, but may also be a pixel circuit with other structures, as long as it may drive the light-emitting device to emit light.

As shown in FIG. 5, the third transistor 510 comprises an active layer (for example, it may be referred to as a first active layer) 511. For example, the active layer 511 is on the buffer layer 501. The buffer layer 501 is on the substrate 201. For example, the active layer 511 comprises a semiconductor layer. For example, a material of the active layer 511 comprise at least one of polysilicon or amorphous silicon.

As shown in FIG. 5, the third transistor 510 further comprises a first insulating layer 512 covering the active layer 511. For example, the first insulating layer 512 is an inorganic insulating layer. For example, a material of the first insulating layer 512 comprises silicon dioxide, silicon nitride, or the like.

As shown in FIG. 5, the third transistor 510 further comprises a gate 513 on a side of the first insulating layer 512 away from the active layer 511. For example, a material of the gate 513 comprises a metal such as molybdenum (Mo).

As shown in FIG. 5, the third transistor 510 further comprises a second insulating layer 514 covering the gate 513. For example, a material of the second insulating layer 514 is an inorganic insulating layer, such as silicon dioxide, silicon nitride, or the like.

As shown in FIG. 5, the third transistor 510 further comprises an interlayer insulating layer 516 on a side of the second insulating layer 514 away from the gate 513. For example, a material of the interlayer insulating layer 516 comprises an inorganic insulating material. For example, the inorganic insulating material comprises silicon dioxide, silicon nitride, or the like.

As shown in FIG. 5, the third transistor 510 further comprises a source 517 and a drain 518 on a side of the interlayer insulating layer 516 away from the second insulating layer 514. For example, a material of the source 517 and a material of the drain 518 comprise at least one of titanium (Ti) or aluminum (Al). For example, the source 517 and the drain 518 each comprises such a three-layer structure as Ti layer/Al layer/Ti layer. The source 517 and the drain 518 are electrically connected to the active layer 511. For example, the source 517 is electrically connected to the active layer 511 through a first conductive via 521 passing through the first insulating layer 512, the second insulating layer 514, and the interlayer insulating layer 516. For another example, the drain 518 is electrically connected to the active layer 511 through a second conductive via 522 passing through the first insulating layer 512, the second insulating layer 514, and the interlayer insulating layer 516.

So far, the third transistor of the sub-pixel according to some embodiments of the present disclosure has been described.

In some embodiments, as shown in FIG. 5, the capacitor 530 comprises a first conductive layer 531 in the same layer as the gate 513. For example, a material of the first conductive layer 531 is the same as a material of the gate 513. This may facilitate the manufacture of the display panel. The first conductive layer 531 is covered by the second insulating layer 514. As shown in FIG. 5, the capacitor 530 further comprises a second conductive layer 532 on a side of the second insulating layer 514 away from the first conductive layer 531. The second conductive layer 532 is covered by the interlayer insulating layer 516. For example, the materials of the first conductive layer 531 and the second conductive layer 532 both comprise metals such as molybdenum. The capacitor 530 may function to store data.

It should be noted that the "the same layer" in the embodiments of the present disclosure refers to a film layer on the same structural layer. In other words, for example, the film layer in the same layer may be a layer structure formed by using the same film forming process to form a film layer for forming a specific pattern, and then using the same mask plate to pattern the film layer through a single patterning process. Depending on different specific patterns, a single patterning process may comprise multiple exposing, developing or etching processes, and the specific pattern in the formed layer structure may be continuous or discontinuous. These specific patterns may also be at different heights or have different thicknesses.

For example, the first conductive layer 531 is in the same layer as the gate 513. The first conductive layer 531 and the gate 513 are both on the first insulating layer 512. For example, the first conductive layer 531 and the gate 513 may be formed by the same patterning process.

In some embodiments, as shown in FIG. 5, each sub-pixel further comprises a third insulating layer 541 covering the source 517 and the drain 518. For example, a material of the third insulating layer 541 comprises silicon dioxide, silicon nitride, or the like.

As shown in FIG. 5, the sub-pixel further comprises a first planarization layer 542 on a side of the third insulating layer 541 away from the source 517 and the drain 518. For example, a material of the first planarization layer 542 comprises an organic insulating material.

As shown in FIG. 5, the sub-pixel further comprises a third conductive layer 543 on a side of the first planarization layer 542 away from the third insulating layer 541. The third conductive layer 543 is electrically connected to the source 517 or the drain 518. For example, a material of the third conductive layer 543 comprises at least one of titanium (Ti) or aluminum (Al). For example, the third conductive layer 543 may comprise such a three-layer structure as Ti layer/Al layer/Ti layer. For example, the third conductive layer 543 is electrically connected to the source 517 or the drain 518 through a third conductive via 523 passing through the third insulating layer 541 and the first planarization layer 542.

As shown in FIG. 5, the sub-pixel further comprises a second planarization layer 544 covering the third conductive layer 543. For example, a material of the second planarization layer 544 comprises an organic insulating material.

As shown in FIG. 5, the sub-pixel further comprises an anode layer 545 on a side of the second planarization layer 544 away from the third conductive layer 543. The anode layer 545 is electrically connected to the third conductive layer 543. For example, the anode layer 545 is electrically connected to the third conductive layer 543 through a fourth conductive via 524 passing through the second planarization layer 544.

As shown in FIG. 5, the sub-pixel further comprises a pixel defining layer 546 on the second planarization layer 544. The pixel defining layer comprising an opening 5461 exposing at least a part of the anode layer 545.

As shown in FIG. 5, the sub-pixel further comprises a functional layer 547 in the opening 5461 and connected to the anode layer 545. For example, the functional layer 547 comprises a light-emitting layer or the like.

As shown in FIG. 5, the sub-pixel further comprises a cathode layer 548 on a side of the functional layer 547 away from the anode layer 545. In the embodiments of the present disclosure, the light emitting device comprises the anode layer 545, the functional layer 547, and the cathode layer 548.

In some embodiments, the display panel comprises an encapsulation layer 549 covering the cathode layer 548.

So far, the structure of the sub-pixel of the display panel according to some embodiments of the present disclosure is provided. The sub-pixels may comprise the third transistor, the capacitor, the light emitting device, and the like. Of course, those skilled in the art may understand that the sub-pixel may also comprise other structures or layers, which will not be described in detail here.

FIG. 6A is a top view showing a multiplexer according to an embodiment of the present disclosure. FIG. 6B is a schematic view showing a cross-section of a multiplexer according to an embodiment of the present disclosure taken along a line A-A' in FIG. 6A.

FIG. 6A shows the multiplexers 221 and 222. As shown in FIG. 6A, each multiplexer 221 or 222 comprises the second electrode 412 and the control electrode 413 of the first transistor, the second electrode 422 and the control electrode 423 of the second transistor, and the first electrode 401 shared by the first transistor and the second transistor. In addition, FIG. 6A also shows an anti-static unit 282 of the electrostatic discharge area 280.

In some embodiments, as shown in FIG. 6A, in each multiplexer 221 or 222, the first electrode 401, the second electrode 412 of the first transistor, and the second electrode 422 of the second transistor are all in the same layer as the source 517 and the drain 518. For example, the first electrode 401, the second electrodes 412 and 422, the source 517, and the drain 518 are all on the interlayer insulating layer 516. As shown in FIG. 6B, the first electrode 401, the second electrode 412 of the first transistor, and the second electrode 422 of the second transistor are all on the interlayer insulating layer 516. Such design as to be in the same layer may facilitate the manufacture of the display panel and save the cost.

In some embodiments, as shown in FIG. 6A, the control electrode 413 of the first transistor and the control electrode 423 of the second transistor are in the same layer as the gate 513. For example, the control electrode 413 of the first transistor, the control electrode 423 of the second transistor and the gate 513 are all on the first insulating layer 512. As shown in FIG. 6B, the control electrode 413 of the first transistor and the control electrode 423 of the second transistor are both on the first insulating layer 512. Such design as to be in the same layer may facilitate the manufacture of the display panel and save the cost.

In some embodiments, as shown in FIG. 6B, in each multiplexer, the first transistor and the second transistor share an active layer (which may be referred to as a second active layer) 414. The second active layer 414 is on the buffer layer 501. Therefore, the second active layer 414 and the active layer (i.e., the first active layer) 511 of the third transistor are in the same layer.

As shown in FIG. 6B, the first electrode 401 is electrically connected to the second active layer 414 through a fifth conductive via 431. The fifth conductive via 431 passes through the interlayer insulating layer 516, the second insulating layer 514, and the first insulating layer 512. The second electrode 412 of the first transistor is electrically connected to the second active layer 414 through a sixth conductive via 432. The sixth conductive via 432 passes through the interlayer insulating layer 516, the second insulating layer 514, and the first insulating layer 512. The second electrode 422 of the second transistor is electrically connected to the second active layer 414 through a seventh conductive via 433. The seventh conductive via 433 passes through the interlayer insulating layer 516, the second insulating layer 514, and the first insulating layer 512. Here, the second electrode 412 of the first transistor is electrically connected to one end of the second active layer 414, and the second electrode 422 of the second transistor is electrically connected to the other end of the second active layer 414.

FIG. 6C is a schematic view showing a cross-section of a multiplexer according to an embodiment of the present disclosure taken along a line B-B' in FIG. 6A.

In some embodiments, as shown in FIGS. 6A and 6C, the signal input line 2210 (for example, which may be referred to as a first signal input line 2211) of the first multiplexer 221 and the signal input line 2210 (for example, which may be referred to as a second signal input line 2212) of the second multiplexer 222 are in different layers.

In some embodiments, the first electrode 401 of the first multiplexer 221 is electrically connected to the signal input line 2210 (i.e., the first signal input line 2211) of the first multiplexer 221. The signal input line of the first multiplexer 221 is in the same layer as the second conductive layer 532. For example, the signal input line of the first multiplexer 221 and the second conductive layer 532 are both on the second insulating layer 514. As shown in FIG. 6C, the first signal input line 2211 is on the second insulating layer 514.

In some embodiments, the first electrode 401 of the second multiplexer 222 is electrically connected to the signal input line 2210 (i.e., the second signal input line 2212) of the second multiplexer 222. The signal input line of the second multiplexer 222 is in the same layer as the gate 513. For example, the signal input line of the second multiplexer 222 and the gate 513 are both on the first insulating layer 512. As shown in FIG. 6C, the second signal input line 2212 is on the first insulating layer 512.

In the above-described embodiment, the signal input line of the first multiplexer is in the same layer as the second conductive layer, and the signal input line of the second multiplexer is in the same layer as the gate, so that it is possible to facilitate the manufacture of the display panel and save the cost. In addition, it is also possible to avoid a risk of short-circuit of the signal input lines of different multiplexers.

FIG. 7A is an enlarged schematic view showing a partial structure of a multiplexer according to an embodiment of the present disclosure at block 610 shown in FIG. 6A.

In some embodiments, as shown in FIGS. 6A and 7A, the display panel may further comprise a first scan signal line 601 and a second scan signal line 602 which are electrically connected to each multiplexer. The first scan signal line 601 is electrically connected to the control electrode 413 of the first transistor. The first scan signal line 601 may transmit the first control signal to the first transistor. The second scan signal line 602 is electrically connected to the control electrode 423 of the second transistor. The second scan signal line 602 may transmit the second control signal to the second transistor. This can realize the control of the multiplexer.

In some embodiments, as shown in FIG. 7A, a number of conductive vias may be provided between two layer structures required to be electrically connected to each other (for example, between the first scan signal line 601 and the control electrode 413 of the first transistor, or the like), which may reduce a connection impedance between the two layer structures.

FIG. 7B is a schematic view showing a cross-section of a structure taken along a line C-C' in FIG. 7A.

As shown in FIG. 7B, the first scan signal line 601 is located on the interlayer insulating layer 516. Therefore, the first scan signal line 601 may be on the same layer as the source 517 and the drain 518 of the third transistor. The first scan signal line is electrically connected to the control electrode 413 of the first transistor through the eighth conductive via 711. The eighth conductive via 711 passes through the interlayer insulating layer 516 and the second insulating layer 514. In addition, the manner in which the second scan signal line 602 is electrically connected to the control electrode 423 of the second transistor is similar to the manner in which the first scan signal line is electrically connected to the control electrode 413 of the first transistor, and thus will not be described in detail here.

FIG. 7C is a schematic view showing a cross-section of a structure taken along a line D-D' in FIG. 7A.

As shown in FIG. 7C, the first electrode 401 of the first multiplexer 221 is electrically connected to the first signal input line 2211 through a ninth conductive via 712. The ninth conductive via 712 passes through the interlayer insulating layer 516. In this way, the electrical connection between the first electrode and the first signal line is realized.

In other embodiments, the first electrode 401 of the second multiplexer 222 is electrically connected to the second signal input line 2212 through a tenth conductive via (not shown). The tenth conductive via passes through the interlayer insulating layer 516 and the second insulating layer 514.

FIG. 8A is an enlarged schematic view showing a partial structure of a multiplexer according to an embodiment of the present disclosure at block 620 shown in FIG. 6A. FIG. 8B is a schematic view showing a cross-section of a structure taken along a line E-E' in FIG. 8A.

As shown in FIGS. 6A and 8A, the two signal output lines of each multiplexer comprise a first signal output line 2201 and a second signal output line 2202. As shown in FIGS. 8A and 8B, the second electrode 412 of the first transistor is electrically connected to the first signal output line 2201. The first signal output line 2201 is in the same layer as the second conductive layer 532. For example, the first signal output line 2201 and the second conductive layer 532 are both on the second insulating layer 514. Such design as to be in the same layer may facilitate the manufacture of the display panel and save the cost.

As shown in FIG. 8B, the first signal output line 2201 is on the second insulating layer 514. The second electrode 412 of the first transistor is electrically connected to the first signal output line 2201 through an eleventh conductive via 811. The eleventh conductive via 811 passes through the interlayer insulating layer 516.

The second electrode 422 of the second transistor is electrically connected to the second signal output line 2202. The second signal output line 2202 is in the same layer as the gate 513. For example, the second signal output line 2202 and the gate 513 are both on the first insulating layer 512. Such design as to be in the same layer may facilitate the manufacture of the display panel and save the cost.

As shown in FIG. 8B, the second signal output line 2202 is on the first insulating layer 512. The second electrode 422 of the second transistor is electrically connected to the second signal output line 2202 through a twelfth conductive via 812. The twelfth conductive via 812 passes through the interlayer insulating layer 516 and the second insulating layer 514.

In other embodiments, if the signal input lines are not connected to other structures (for example, electrodes) in a layer-change manner, the signal input lines may be integrally formed. In other embodiments, if the signal output lines are not connected to other structures (for example, electrodes)s in a layer-change manner, the signal output lines may be integrally formed.

FIG. 9 is a schematic view showing a structure of a bending area of a display panel according to an embodiment of the present disclosure.

As shown in FIG. 9, the bending area 210 comprises a plurality of first wires 211. Each of the plurality of first wires 211 is in the same layer as the third conductive layer 543. For example, the first wire 211 and the third conductive layer 543 are both on the first planarization layer 542. Such design as to be in the same layer may facilitate the manufacture of the display panel and save the cost.

As shown in FIG. 9, each first wire 211 is electrically connected to the display area through a second wire 902 or a third wire 903. The second wire 902 is in the same layer as the gate 513. For example, the second wire 902 and the gate 513 are both on the first insulating layer 512. The third wire 903 is in the same layer as the second conductive layer 532. For example, the third wire 903 and the second conductive layer 532 are both on the second insulating layer 514. Such design may avoid short-circuit between the second wire and the third wire as much as possible.

In an embodiment of the present disclosure, a display device is also provided. The display device comprises the display panel as described above. For example, the display device is any product or member having a display function, such as a mobile phone, a tablet computer, a television, a display, a notebook computer, a digital photo frame, a navigator, or the like.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above-described embodiments or equivalently substitution of part of the technical features may be made without departing from the scope and spirit of the present disclosure. The scope of the present disclosure is defined by the appended claims.

What is claimed is:

1. A display panel, comprising:
a display area comprising a pixel array on a substrate, the pixel array comprising a plurality of sub-pixels; and
a peripheral area surrounding the display area, the peripheral area comprising:
a bending area on a side of the display area, wherein the bending area is an area from a starting position of a surface curvature of the substrate to an ending position of the surface curvature of the substrate;
a plurality of multiplexers on a side of the bending area away from the display area, wherein the plurality of multiplexers are on the substrate, the plurality of multiplexers are electrically connected to the plurality of sub-pixels through the bending area, and each of the plurality of multiplexers is at least connected with a signal input line and two signal output lines, an orthographic projection of the signal input line on the substrate does not overlap with an orthographic projection of the bending area on the substrate
a bonding area on a side of the plurality of multiplexers away from the bending area, wherein the bonding area is electrically connected to the signal input line;
a first fanout area between the bending area and the display area;

a second fanout area between the bending area and the plurality of multiplexers;
a third fanout area between the plurality of multiplexers and the bonding area; wherein the bonding area is electrically connected to the plurality of multiplexers through the third fanout area, and the plurality of multiplexers are electrically connected to the plurality of sub-pixels through the second fanout area, the bending area and the first fanout area;
a cell test area between the plurality of multiplexers and the second fanout area, wherein the cell test area is electrically connected to the plurality of sub-pixels through the second fanout area, the bending area and the first fanout area; and
an electrostatic discharge area between the cell test area and the plurality of multiplexers, wherein the electrostatic discharge area is electrically connected to the plurality of multiplexers, and the electrostatic discharge area is electrically connected to the cell test area,
wherein the substrate comprises a first portion covered by the bending area, and a second portion and a third portion which are connected to the first portion, the second portion and the third portion are opposite to each other such that a projection of the third portion onto the second portion overlaps the second portion, the display area and the first fanout area are on a surface of the second portion facing away from the third portion, and the second fanout area, the cell test area, the electrostatic discharge area, the plurality of multiplexers, the third fanout area and the bonding area are disposed on a surface of the third portion facing away from the second portion;
wherein each of the plurality of sub-pixels further comprises:
a third transistor comprising an active layer, and a source and a drain each electrically connected to the active layer;
a third insulating layer covering the source and the drain;
a first planarization layer on a side of the third insulating layer away from the source and the drain; and
a third conductive layer on a side of the first planarization layer away from the third insulating layer, wherein the third conductive layer is electrically connected to the source or the drain;
wherein the bending area comprises a plurality of first wires, each of which is in the same layer as the third conductive layer, and is electrically connected to the display area through a second wire or a third wire, the second wire and the third wire being in different layers; and
wherein the two signal output lines are in different layers, and each of the two signal output lines is connected to a column of sub-pixels sequentially through one of the plurality of first wires and the second wire or the third wire connected to the one of the plurality of first wires.

2. The display panel according to claim 1, wherein each of the plurality of multiplexers comprises:
a first transistor comprising a first electrode, a second electrode, and a control electrode, wherein the first electrode is electrically connected to the bonding area through the signal input line, the first electrode is configured to receive a data signal, the second electrode of the first transistor is electrically connected to a first column of sub-pixels through one signal output line of the two signal output lines, and the control electrode of the first transistor is configured to receive a first control signal; and a second transistor comprising the first electrode shared with the first transistor, a second electrode, and a control electrode, wherein the second electrode of the second transistor is electrically connected to a second column of sub-pixels through another signal output line of the two signal output lines, and the control electrode of the second transistor is configured to receive a second control signal.

3. The display panel according to claim 2, wherein the third transistor comprises:

an active layer;

a first insulating layer covering the active layer;

a gate on a side of the first insulating layer away from the active layer;

a second insulating layer covering the gate;

an interlayer insulating layer on a side of the second insulating layer away from the gate; and the source and the drain on a side of the interlayer insulating layer away from the second insulating layer; and each of the plurality of sub-pixels further comprises a capacitor comprising:

a first conductive layer in the same layer as the gate, wherein the first conductive layer is covered by the second insulating layer; and a second conductive layer on a side of the second insulating layer away from the first conductive layer, wherein the second conductive layer is covered by the interlayer insulating layer.

4. The display panel according to claim 3, wherein in each of the plurality of multiplexers:

the first electrode, the second electrode of the first transistor, and the second electrode of the second transistor are all in the same layer as the source and the drain; and the control electrode of the first transistor and the control electrode of the second transistor are in the same layer as the gate.

5. The display panel according to claim 3, wherein the plurality of multiplexers comprise a first multiplexer and a second multiplexer, and the signal input line of the first multiplexer and the signal input line of the second multiplexer are in different layers.

6. The display panel according to claim 5, wherein:

the first electrode of the first multiplexer is electrically connected to the signal input line of the first multiplexer, and the signal input line of the first multiplexer is in the same layer as the second conductive layer; and the first electrode of the second multiplexer is electrically connected to the signal input line of the second multiplexer, and the signal input line of the second multiplexer is in the same layer as the gate.

7. The display panel according to claim 3, wherein the two signal output lines comprise:

a first signal output line in the same layer as the second conductive layer, wherein the first signal output line is electrically connected to the second electrode of the first transistor; and a second signal output line in the same layer as the gate, wherein the second signal output line is electrically connected to the second electrode of the second transistor.

8. The display panel according to claim 3, wherein each of the plurality of sub-pixels further comprises:

a second planarization layer covering the third conductive layer;

an anode layer on a side of the second planarization layer away from the third conductive layer, wherein the anode layer is electrically connected to the third conductive layer;

a pixel defining layer on the second planarization layer, the pixel defining layer comprising an opening exposing at least a part of the anode layer;

a functional layer in the opening and connected to the anode layer; and a cathode layer on a side of the functional layer away from the anode layer.

9. The display panel according to claim 8, wherein:

the second wire is in the same layer as the gate, and the third wire is in the same layer as the second conductive layer.

10. A display device, comprising: the display panel according to claim 1.

11. The display panel according to claim 1, wherein the plurality of multiplexers comprise a first multiplexer and a second multiplexer, the second multiplexer being further away from the bending area than the first multiplexer, each of the two signal output lines is electrically connected to all sub-pixels of a column of sub-pixels, the two signal output lines of the second multiplexer are between two first multiplexers most adjacent to the second multiplexer, and the two signal output lines of the second multiplexer do not cross with signal output lines of the two first multiplexers most adjacent to the second multiplexer.

* * * * *